United States Patent [19]
Uemura et al.

[11] Patent Number: 5,815,019
[45] Date of Patent: Sep. 29, 1998

[54] FLIP-FLOP CIRCUIT OPERATING ON LOW VOLTAGE

[75] Inventors: Gohiko Uemura; Jun Yoshida, both of Tokyo, Japan

[73] Assignee: NEC Corporation, Tokyo, Japan

[21] Appl. No.: 710,860

[22] Filed: Sep. 23, 1996

[30] Foreign Application Priority Data

Oct. 9, 1995 [JP] Japan .................................... 7-261168

[51] Int. Cl.⁶ .................................................. H03K 3/284
[52] U.S. Cl. ........................ 327/202; 327/185; 327/199; 327/200; 327/201
[58] Field of Search .................................. 327/185, 197, 327/198, 199, 200, 201, 202, 222

[56] References Cited

U.S. PATENT DOCUMENTS

| | | | |
|---|---|---|---|
| 4,779,009 | 10/1988 | Tsunoi et al. ........................... | 307/272 |
| 4,977,335 | 12/1990 | Ogawa .................................. | 307/272.2 |
| 5,017,814 | 5/1991 | Lloyd ..................................... | 307/480 |

FOREIGN PATENT DOCUMENTS

| | | |
|---|---|---|
| 2-21717 | 1/1990 | Japan . |
| 7-30405 | 1/1995 | Japan . |

*Primary Examiner*—Timothy P. Callahan
*Assistant Examiner*—An T. Luu
*Attorney, Agent, or Firm*—Foley & Lardner

[57] ABSTRACT

Disclosed herein is a flip/flop circuit of a master-slave type including master side and slave side latch/hold circuits 1 and 2 each being of an ECL vertical 1-step construction, first and second bias circuits 3 and 4 for biasing current sources Tr's 21 to 24 of these latch/hold circuits 1 and 2 and a control circuit 5 for pull-down controlling these first and second bias circuits 3 and 4 by clock signals. The current sources Tr's 21 to 24 are thus selectively rendered conductive and non-conductive to perform a flip-flop operation on a low power source voltage such as 1V or less.

7 Claims, 9 Drawing Sheets

FLIP-FLOP CIRCUIT OPERATING ON LOW VOLTAGE

BACKGROUND OF THE INVENTION

The present invention relates to a flip-flop circuit and, particularly, to a flip-flop circuit (referred to hereinafter as F/F circuit) with an ECL (Emitter Coupled Logic) construction.

In general, a F/F circuit is constructed with master side and slave side latch/hold circuits each including constant current sources.

FIG. 8 is a F/F circuit diagram showing an example of such a conventional circuit. As shown in FIG. 8, this F/F circuit includes a master side latch/hold circuit 1 connected to data input terminals 71 and 72 to which true and complementary input data signals are supplied, and a slave side latch/hold circuit 2 connected to the output of the master side latch/hold circuit 1 for outputting true and complementary output data signals at data output terminals 75 and 76. There are further provided transistors (referred to as Tr hereinafter) 31 and 32 driven by clocks of positive phase and negative phase supplied to clock input terminals 73 and 74 and constant current sources 54 and 55 for supplying constant currents to the Tr's 31 and 32. The master side latch/hold circuit 1 is constructed with Tr's 11 and 14, Tr's 12 and 13 and Tr's 27 and 28, which constitute the so-called Gilbert cells, load resistors 41 and 42 and a constant current source 51. The slave side latch/hold circuit 2 is constructed with Gilbert cells including Tr's 15~18, 29 and 30, load resistors 43 and 44 and a constant current source 53.

In this F/F circuit, the true and complementary input data signals are supplied through the data input terminals 71 and 72 to the bases of the Tr's 11 and 14 which constitute a differential pair, respectively. Further, the bases of the Tr's 15 and 18 are connected to the collectors of the Tr's 13 and 14 and to the collectors of the Tr's 11 and 12, respectively and are supplied with data outputs of positive phase and negative phase of the master side latch/hold circuit 1. Further, the clocks of negative phase and positive phase input through the clock input terminals 74 and 73 are supplied to the bases of the Tr's 27 and 30 and the Tr's 28 and 29 through an emitter follower constituted with the Tr's 32 and 31 and the constant current sources 55 and 54, respectively. Therefore, the master side latch/hold circuit 1 and the slave side latch/hold circuit 2 output data of positive phase and negative phase at the data output terminals 75 and 76 while repeating mutually opposite operations, respectively.

In operation, when the positive phase clock supplied to the input terminal 73 is high (H) and the negative phase clock supplied to the clock input terminal 74 is low (L), the Tr's 27 and 30 are turned ON and the Tr's 28 and 29 are turned OFF. Therefore, the master side latch/hold circuit 1 becomes the holding state, and the slave side latch/hold circuit 2 becomes the latching state.

When the clock input terminal 73 is changed to be low (L) and the clock input terminal 74 is changed to be high (H), the Tr's 27 and 30 turn OFF and the Tr's 28 and 29 turn ON. In this case, the master side latch/hold circuit 1 becomes the latching state, and the slave side latch/hold circuit 2 becomes the holding state.

In this manner, the above F/F circuit performs a flip-flop operation by repeating the mutually opposite operations of the master side latch/hold circuit 1 and the slave side latch/hold circuit 2. The Tr's 31 and 32 which form the emitter follower are used to set a level of the clock signal to be supplied to the Tr's 27 to 30 lower than that of the Tr's 11 to 14 and 15 to 18 by a base-emitter voltage (Vbe) of a transistor.

In concrete, the above F/F circuit operates on a power source voltage of 2.45V (=2Vbe+Vsat+Vrcs), where Vbe is an ON voltage of a bipolar transistor or 0.9V, Vsat is a saturation voltage of the current source transistor or 0.4V, and Vrcs is a voltage across an emitter resistor of the current source or 0.25V.

On the other hand, such an F/F circuit that operates on a power source voltage in the order of 1.8V is disclosed in Japanese Laid-open Patent Publication Hei 7-30405 and shown in FIG. 9.

The F/F circuit shown in FIG. 9 includes a master side latch/hold circuit 1 having with Tr's 11–14, load resistors 41 and 42 and Tr's 21 and 22 which constitute constant current sources, a slave side latch/hold circuit 2 having Tr's 15–18, load resistors 43 and 44 and Tr's 23 and 24 which constitute a constant current source, Tr's 31 and 32 as clock input switching transistors, level shift resistors 49 and 50, and diode-connected Tr's 25 and 26.

In operation, clocks of positive phase and negative phase input from respective clock input terminals are shifted in level through the Tr's 31 and 32 by the resistors 49 and 50 and determine base potentials of the Tr's 25 and 26, respectively.

In such a situation, when values of the resistors 49 and 50 are set such that, when a clock input terminal 73 is high and a clock input terminal 74 is low, the Tr 25 is turned ON and the Tr 26 is turned OFF, the Tr's 22 and 23 which form, together with the Tr 25, a current mirror are turned ON and the Tr's 21 and 24 which form, together with the Tr 26, a current mirror are turned OFF. Therefore, the master side latch/hold circuit 1 becomes the holding state, and the slave side latch/hold circuit 2 becomes the latching state.

On the other hand, when the clock input terminal 73 is low and the clock input terminal 74 is high, the master side latch/hold circuit 1 becomes the latching state, and the slave side latch/hold circuit 2 becomes the holding state.

In this manner, a flip-flop operation is performed by the alternate operations of the master side latch/hold circuit 1 and the slave side latch/hold circuit 2. Further, since such a F/F circuit has a 2-step vertical construction including the Tr's 31 and 32 and the Tr's 25 and 26, which constitute the clock input circuits, its low voltage operation thereof is at 2Vbe, that is, in the order of 1.8V, at most. In other words, since the clock input terminals 73 and 74 include the emitter followers whose outputs are supplied through the resistors 49 and 50 to the Tr's 25 and 26 which have collectors short-circuited to the bases, and these transistors are arranged to constitute the 2-step vertical construction, it becomes difficult to operate with the power source voltage 77 lower than 1.8V.

In a recent years, battery-driven portable communication devices have been spread widely, and an F/F circuit to be used in such devices is required to operate at a lower voltage. To this end, another F/F circuit is disclosed in Japanese Laid-open Patent Publication Hei 2-21717 or U.S. Pat. No. 4,977,335. Such a circuit is shown in FIG. 10.

This circuit includes a master side latch/hold circuit 1a having Tr's 11 to 14, load resistors 41 and 42 and constant current sources 56 and 57, a slave side latch/hold circuit 2a having Tr's 15 to 18, load resistors 43 and 44 and constant current sources 58 and 59, large Tr's 33 to 36 which become a path for receiving currents of the constant current sources 56 to 59 of these latch/hold circuits 1a and 2a, and a differential amplifier circuit 8 composed of Tr's 19 and 20 which have bases connected to respective clock input terminals 74 and 73, load resistors 45 and 46 and a constant current source 51. The size of each of the Tr's 33 to 36 is four times that of Tr's 11 to 14, Tr's 15 to 18, Tr 19 or Tr 20.

In this F/F circuit, clocks of positive phase and negative phase input from respective clock input terminals 73 and 74 are amplified by the differential amplifier circuit 8 and supplied to the large Tr's 33 to 36. First, when the clock input terminal 73 is high and the clock input terminal 74 is low, the Tr's 33 and 34 are turned ON and the Tr's 35 and 36 are turned OFF. Since, among others, the Tr 33 pulls in current of the constant current source 57, the Tr's 11 and 14 are turned OFF. On the other, since, in this case, the Tr 36 had been OFF, the Tr's 12 and 13 are turned ON. Therefore, the master side latch/hold circuit la becomes the holding state. Further, since the Tr 34 pulls in current of the constant current source 58, the Tr's 16 and 17 are turned OFF and, similarly, since the Tr 35 has been OFF, the Tr's 15 and 18 are turned ON. Therefore, the slave side latch/hold circuit 2a becomes the latching state.

On the other hand, when the clock input terminal 73 is low and the clock input terminal 74 is high, the master side latch/hold circuit la becomes the latching state, and the slave side latch/hold circuit 2a becomes the holding state.

Such a F/F circuit can also perform the flip-flop operation since the master side latch/hold circuit 1a and the slave side latch/hold circuit 2a repeat their operations alternately. Incidentally, the reason for the employment of the Tr's 33 to 36 each having a size which is four times that of other transistors is to make the clock signals forcible compared with data signal.

Thus, it is possible to operate the F/F circuit shown in FIG. 10 with a power source voltage of 1V or less since all of the Tr's 11 to 18, the Tr's 33 and 34 and the Tr's 19 and 20 have a vertical 1-step construction. However, it is necessary to set the high level of the clock signal to a value apparently higher than the high level of the data signal in the order of 60 mV by changing the transistor size, since the clock signal is forcible.

As described above, various types of an F/F circuit have been proposed. However, the F/F circuit shown in FIG. 8 has a defect in that, since it utilizes the current sources composed of the transistors and a resistors connected to the emitters thereof and has the vertical 2-step construction, it is impossible to use the power source voltage of 2.45V or less.

On the other hand, the F/F circuit shown in FIG. 9 has a defect in that, since it comprises, in addition to the master side latch/hold circuit 1 connected to the data input terminals 71 and 72 and the slave side latch/hold circuit 2 connected to the output side of the master side latch/hold circuit 1, emitter followers composed of the Tr's 31 and 32 in the clock input terminals 73 and 74, the clock outputs are supplied through the resistors 49 and 50 to the Tr's 25 and 26 whose collectors are connected to the bases, respectively, and the Tr's 21 to 24 of the master side and slave side latch/hold circuits 1 and 2 and the Tr's 25 and 31 and Tr's 26 and 32 are arranged in the vertical 2-step construction, it is impossible to operate it with a low voltage as low as 1.8V or less.

The F/F circuit shown in FIG. 10 can operate at a voltage as low as in the order of 1V. However, since, in order to make the clock signal forcible, the emitter area of each of the Tr's 33~36 is 10 times that of the usual Tr, the threshold voltage of the data signal in the differential circuit, composed of the master side latch/hold circuit 1a or the slave side latch/hold circuit 2a and the Tr's 33–36, is higher than the threshold voltage of the clock signal by 60 mV (=26 mV×1n10) and so "low" of the clock signal is hardly recognized, and there is a problem of the stable operation at low voltage. Further, the F/F circuit shown in FIG. 10 has defects in that, since it requires 5 constant current sources in a conduction state, it is impossible to reduce current and that, since the size of the Tr's 33 to 36 must be large, it is impossible to realize the high integration.

SUMMARY OF THE INVENTION

It is therefore a major object of the present invention to provide a F/F circuit capable of operating stably even when the power source voltage becomes 1V or less.

A F/F circuit according to the present invention comprises a master side latch/hold circuit including two differential pairs of transistors and current source transistors for supplying currents to load resistors and the differential pairs of the differential transistors and having an ECL vertical 1-step construction having an input side connected to data input terminals for receiving data of positive phase and negative phase, a slave side latch/hold circuit including two differential pairs of transistors and current source transistors for supplying current to load resistors and the differential pairs of the transistors and having an ECL vertical 1-step construction having an input side connected to an output side of the master side latch/hold circuit and an output side connected to data output terminals, first and second bias circuits each including a transistor having a collector short-circuited to a base and a load resistor, for biasing bases of the power source transistors of the respective master side and slave side latch/hold circuits and a control circuit including a differential pair of transistors having bases supplied with clock signals of positive phase and negative phase and emitters connected commonly and a constant current source connected to the emitters of the differential pair of the transistors, for alternately pulling down the first and second bias circuits from collectors of the differential pair of the transistors, wherein the current source transistors of the master side latch/hold circuit and the slave side latch/hold circuit are selectively ON/OFF controlled by the clock signals.

Preferably, the first and second bias circuits of the F/F circuit of the present invention includes third and fourth resistors connected between the other ends of the first and second resistors having one end connected to the power source and the collectors of the first and second transistors, respectively.

It is convenient that the first and second resistors of the first and second bias circuits are divided, and the clock signal outputs of the control circuit are supplied to the dividing points, respectively.

The first and second resistors of the first and second bias circuits may be divided, and the clock signal outputs of the control circuit are supplied the dividing points, respectively, and the first and second bias circuits comprise third and fourth resistors connected between the collectors and the bases of the first and second resistors, respectively.

The first and second bias circuits may comprise third and fourth resistors connected between the other ends of the first and second resistors having one end connected to the power source and the collectors of the first and second transistors, respectively, and the clock signal outputs of the control circuit may be directly supplied to the collectors of the first and second transistors, respectively.

BRIEF DESCRIPTION OF THE DRAWINGS

The above and other objects, advantages and features of the present invention will be more apparent from the following description taken in conjunction with the accompany drawings, in which.

DETAILED DESCRIPTION OF THE EMBODIMENTS

Figure 1:
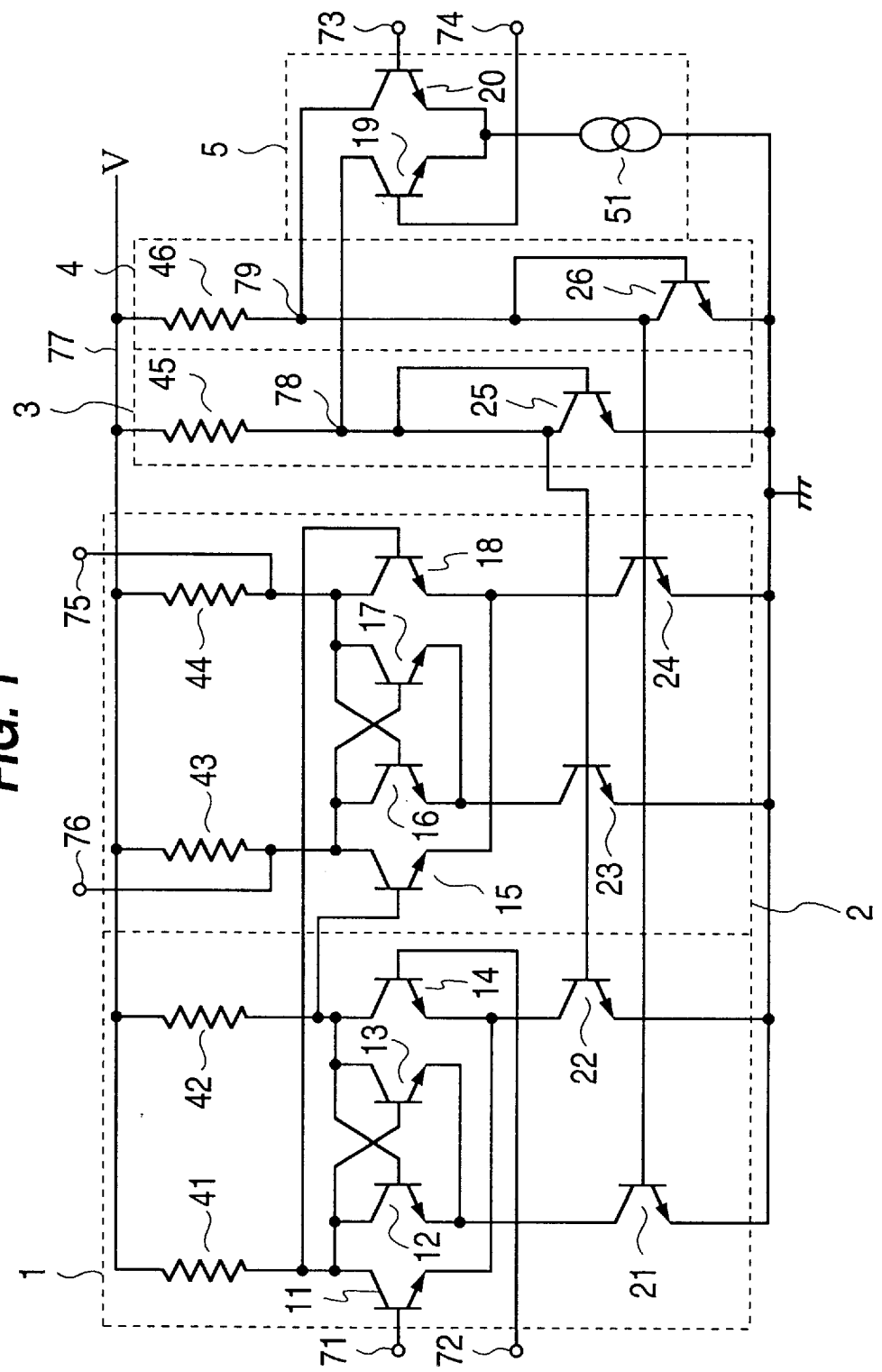
FIG. 1 is a circuit diagram of an F/F circuit according to a first embodiment of the present invention.

Referring now to FIG. 1, a F/F circuit according to the first embodiment of the present invention includes a master side latch/hold circuit 1 of an ECL vertical 1-step construction having an input side connected to data input terminals 71 and 72, and a slave side latch/hold circuit 2 of an ECL vertical 1-step construction which, in order to operate it oppositely to the latch/hold circuit 1, has an input side connected to an output side of the master side latch/hold circuit 1 and an output side connected to data output terminals 75 and 76. Further provided are first and second bias circuits 3 and 4 for supplying bias voltages to operate the master side and slave side latch/hold circuits 1 and 2 and a control circuit 5 for supplying clock signals of positive phase and negative phase from clock input terminals 73 and 74, differentially amplifying them and controlling operation voltages of the first and second bias circuits 3 and 4.

Figure 9:
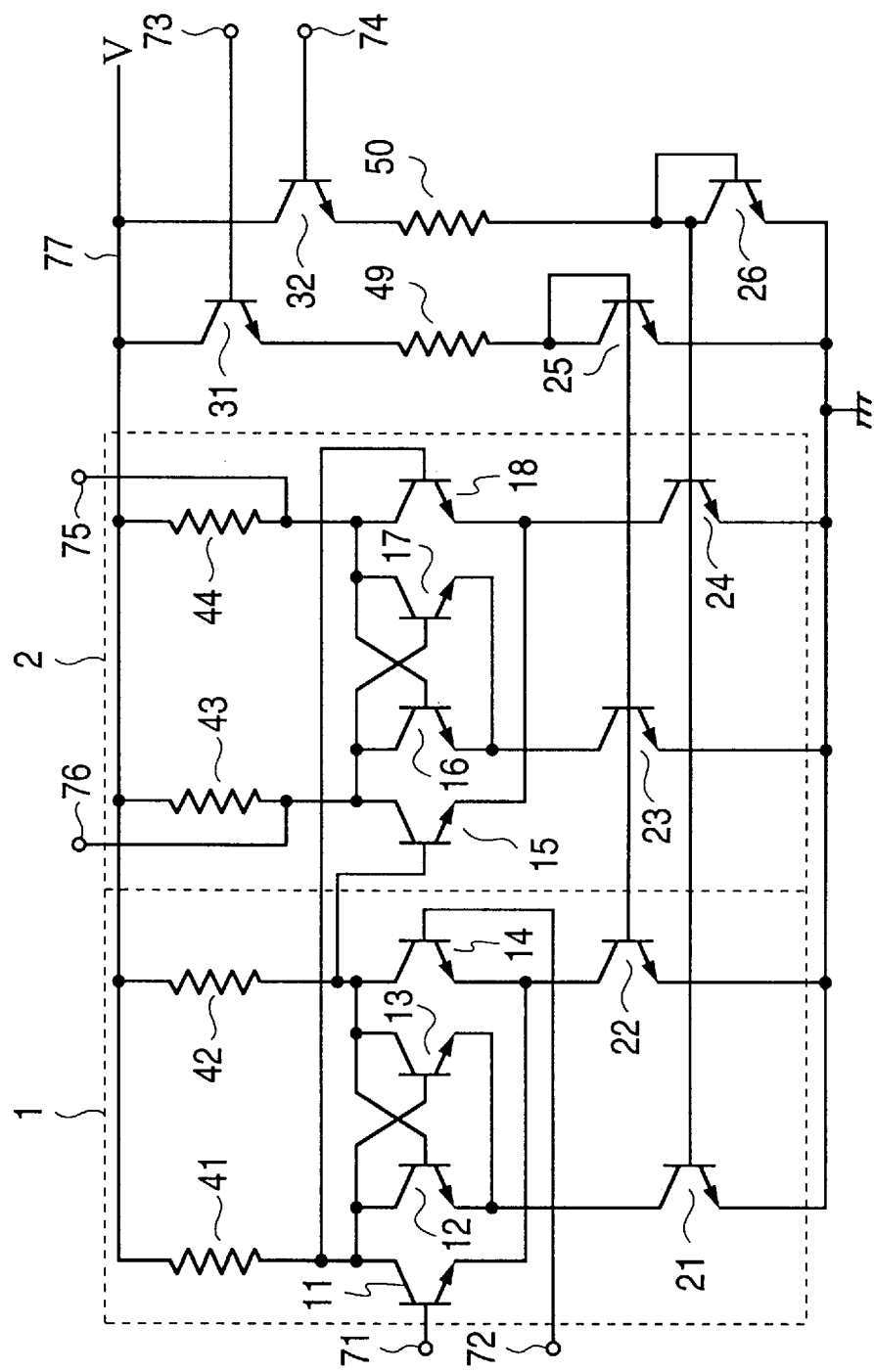
FIG. 9 is a circuit diagram of another example of another prior art F/F circuit.

It is noted that the master side and slave side latch/hold circuits 1 and 2 are the basically same as those as shown in FIG. 9. That is, the master side latch/hold circuit 1 has differential pair of Tr's 11 and 14 which have bases connected to a positive and negative phase data input terminals 71 and 72 and emitters connected commonly, respectively, load resistors connected between collectors of the Tr's 11 and 14 and a power source line 77, a differential pair of Tr's 12 and 13 which have collectors connected to the collectors of the Tr's 11 and 14, emitters commonly connected and bases connected to the collectors of the Tr's 14 and 11, respectively, and Tr's 21 and 22 as current sources which have collectors connected to the emitters of the Tr's 12 and 13 and the emitters of the Tr's 11 and 14 and emitters connected to GND, respectively. The slave side latch/hold circuit 2 is constructed with a differential pair of Tr's 15 and 18 connected to an output side of the master latch/hold circuit 1, that is, having bases connected to the collectors of the Tr's 11 and 14, respectively, load resistors 43 and 44, a differential pair of Tr's 16 and 17 which have collectors connected to the collectors of the Tr's 15 and 18 and Tr's 23 and 24 as current sources which have collectors connected to the emitters of the Tr's 16 and 17 and the emitters of the Tr's 15 and 18 and emitters connected to GND, respectively. An output side of the slave side latch/hold circuit 2, that is, the collectors of the Tr's 18 and 15, are connected to positive and negative phase data output terminals 75 and 76, respectively.

In accordance with one feature of the invention, however, voltages for driving the Tr's 21 to 24 are controlled to alternately operate the master side latch/hold circuit 1 and the slave side latch/hold circuit 2. To this end, there are provided a control circuit 5 including Tr's 20 and 19 having emitters connected in common and bases supplied with positive and negative phase clocks from clock input terminals 73 and 74, respectively, and a constant current source 51 connected between the common emitter of the Tr's 20 and 19 and GND, a first bias circuit 3 including a resistor 45 series-connected between the power source line 77 and the GND and a Tr 25 having a short-circuited collector-base to form a diode construction for biasing the operating voltages of the Tr's 22 and 23 of the master side and slave side latch/hold circuits 1 and 2 by an ON-OFF operation of the Tr 25 due to a negative phase output of the side of the Tr 19 of the control circuit 5 supplied to a node 78, and a second bias circuit 4 including a resistor 46 series-connected between the power source line 77 and the GND and a Tr 26 having a short-circuited collector-base to form a diode construction for biasing the operating voltages of the Tr's 21 and 24 of the master side and slave side latch/hold circuits 1 and 2 by an ON-OFF operation of the Tr 26 due to a positive phase output of the side of the Tr 20 of the control circuit 5 supplied to a node 79. Particularly, the control circuit 5 has a function to pull down a potential of one of the nodes 78 and 79.

With the control circuit 5 and the first and second bias circuits 3 and 4, when, for example, a positive phase clock is input to the positive phase clock input terminal 73, the Tr 20 is turned ON (accordingly the Tr 19 is turned OFF) and a larger current flows through the resistor 46. Since the potential of the node 79 is thereby lowered, the Tr 26 is turned OFF and the Tr's 21 and 24 are turned OFF. On the other hand, in case where a negative phase clock is input to the negative phase clock input terminal 74, the Tr's 22 and 23 are turned OFF. Therefore, the master side and slave side latch/hold circuits 1 and 2 perform the flip-flop operation, so that a positive phase data and a negative phase data are output alternately from the data output terminals 75 and 76, respectively.

Figure 2:
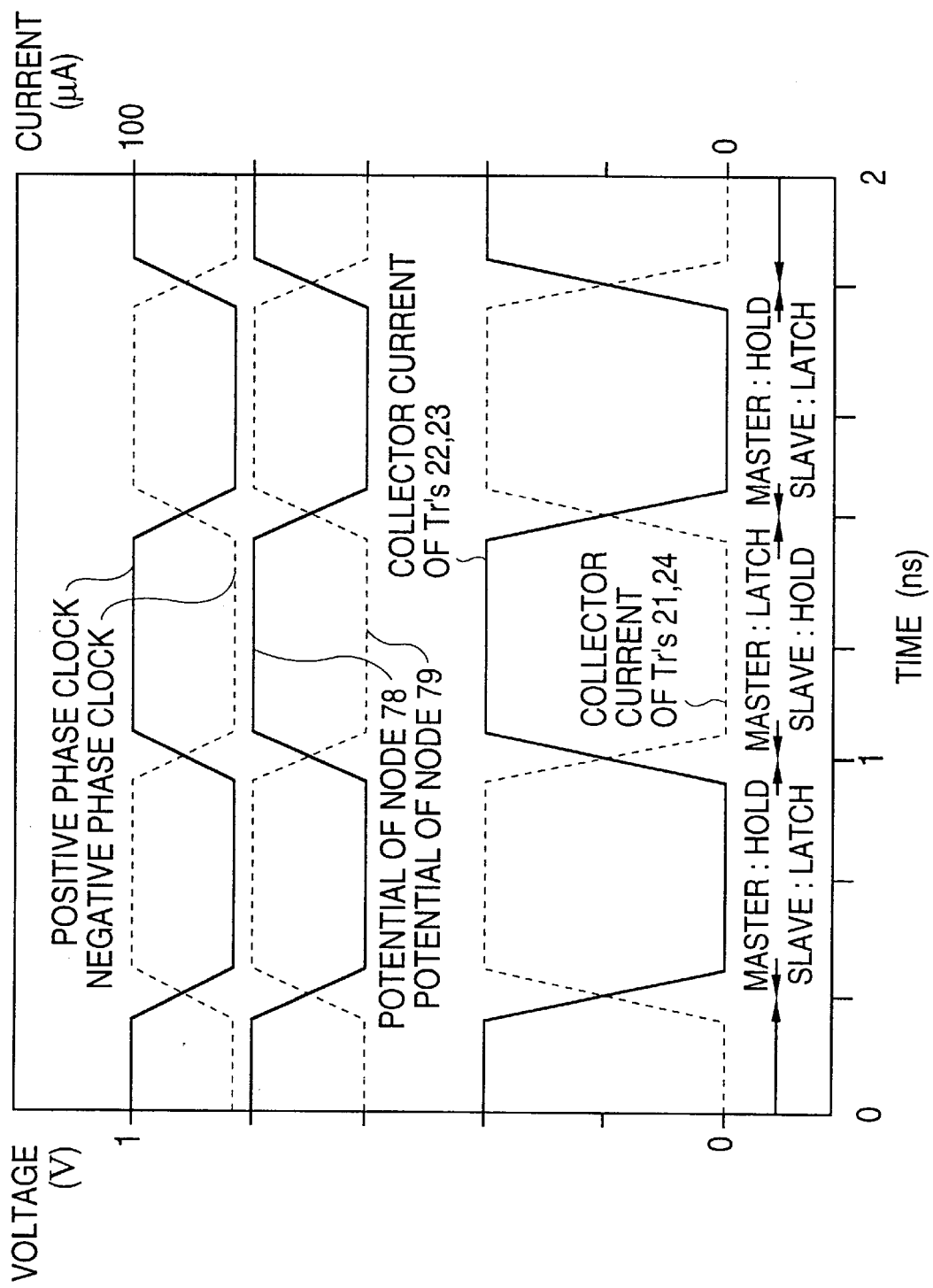
FIG. 2 is a current-voltage characteristics diagram for explaining the circuit operation in FIG. 1.

Description will be now made on the operation of the F/F circuit with reference also to FIG. 2 which shows a current-voltage characteristics diagram for explaining a circuit operation in FIG. 1. In FIG. 2, this current-voltage characteristics diagram shows collector currents of the Tr's 21 to 24 and potentials at the nodes 78 and 79 when a power source voltage of the F/F circuit shown in FIG. 1 is 1V and positive and negative phase clocks are input to the clock input terminals 73 and 74, respectively. In this example, the circuit constants are set such that 0.8V appears at the nodes 78 and 79 when it is high and (0.8-α)V appears thereat when it is low. Assuming α=0.2(V), when the positive phase clock input terminal 73 is high (the negative phase clock input terminal 74 is low), the node 79 becomes low (0.6V), the node 78 becomes high (0.8V), the Tr 25 is turned ON and the Tr 26 is turned OFF. Since, therefore, the bases of the Tr's 22 and 23 become 0.8V and the Tr's 22 and 23 are turned ON and OFF, respectively, the collector currents thereof become 0.4 μA. Since, in this case, the Tr's 21 and 24 are turned OFF, the collector currents are 0. Therefore, the master side latch/hold circuit 1 becomes the latching state, and the slave side latch/hold circuit 2 becomes the holding state.

On the other hand, when the positive phase clock input terminal 73 is low (the negative phase clock input terminal 74 is high), the node 79 becomes high (0.8V), the node 78 becomes low (0.6V), the Tr 25 is turned OFF and the Tr 26 is turned ON. Since, therefore, the Tr's 22 and 23 are turned OFF and the Tr's 21 and 24 are turned ON. Therefore, the master side latch/hold circuit 1 becomes the holding state and the slave side latch/hold circuit 2 becomes the latching state.

Figure 3:
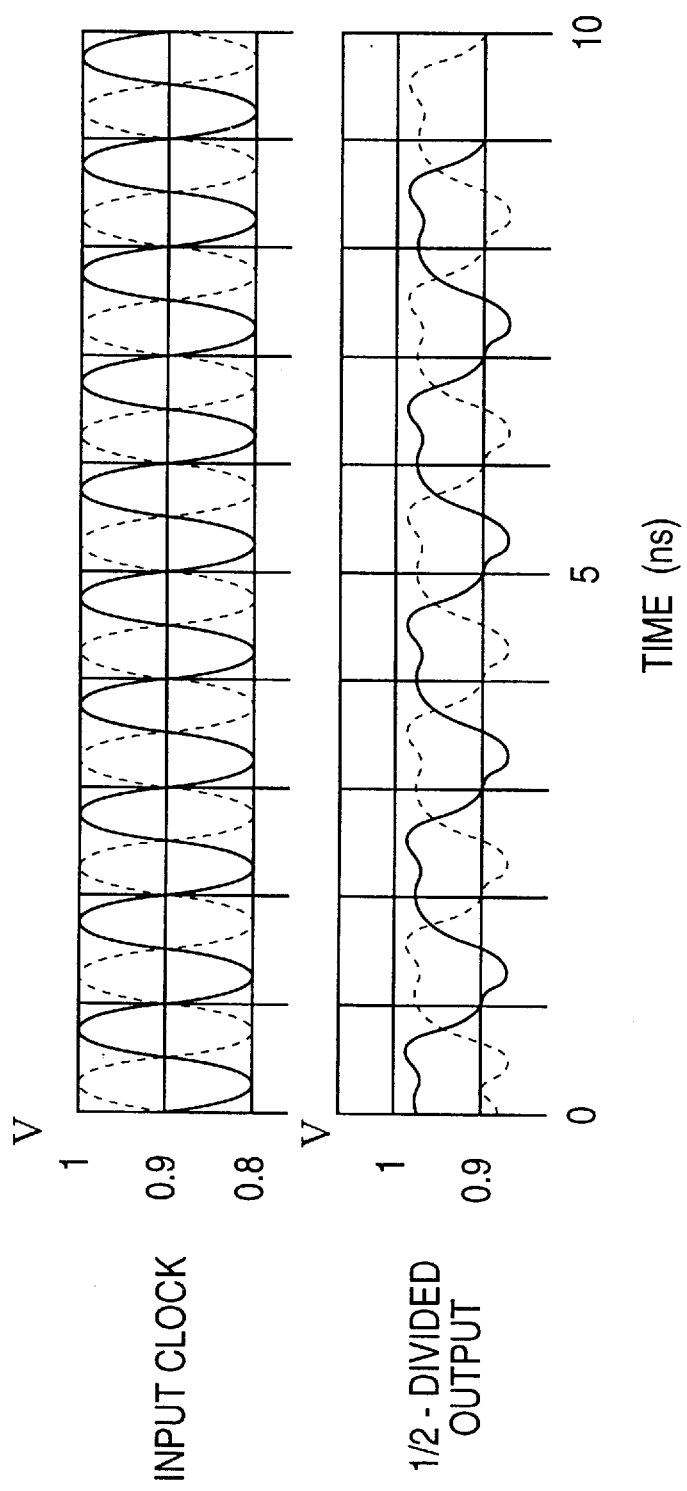
FIG. 3 is an input clock and data output waveforms of the F/F circuit shown in FIG. 1.

The F/F circuit performs the flip-flop operation in this manner by repeated alternate holding and latching states of the master side latch/hold circuit 1 and the slave side latch/hold circuit 2. FIG. 3 shows waveforms of the input clock and data output of the F/F circuit shown in FIG. 1. As shown in FIG. 3, these input and output waveforms correspond to a clock input and a data output of a T-FF circuit which is the F/F circuit shown in FIG. 1 with the positive phase data output terminal 75 being connected to the negative phase data input terminal 72 and the negative phase data output terminal 76 being connected to the positive phase data input terminal 71, respectively. In this case, the power source voltage of the F/F circuit is 1V and the F/F circuit operates to divide an input frequency of 1 GHz by 2 to thereby function as the T-FF.

Figure 10:
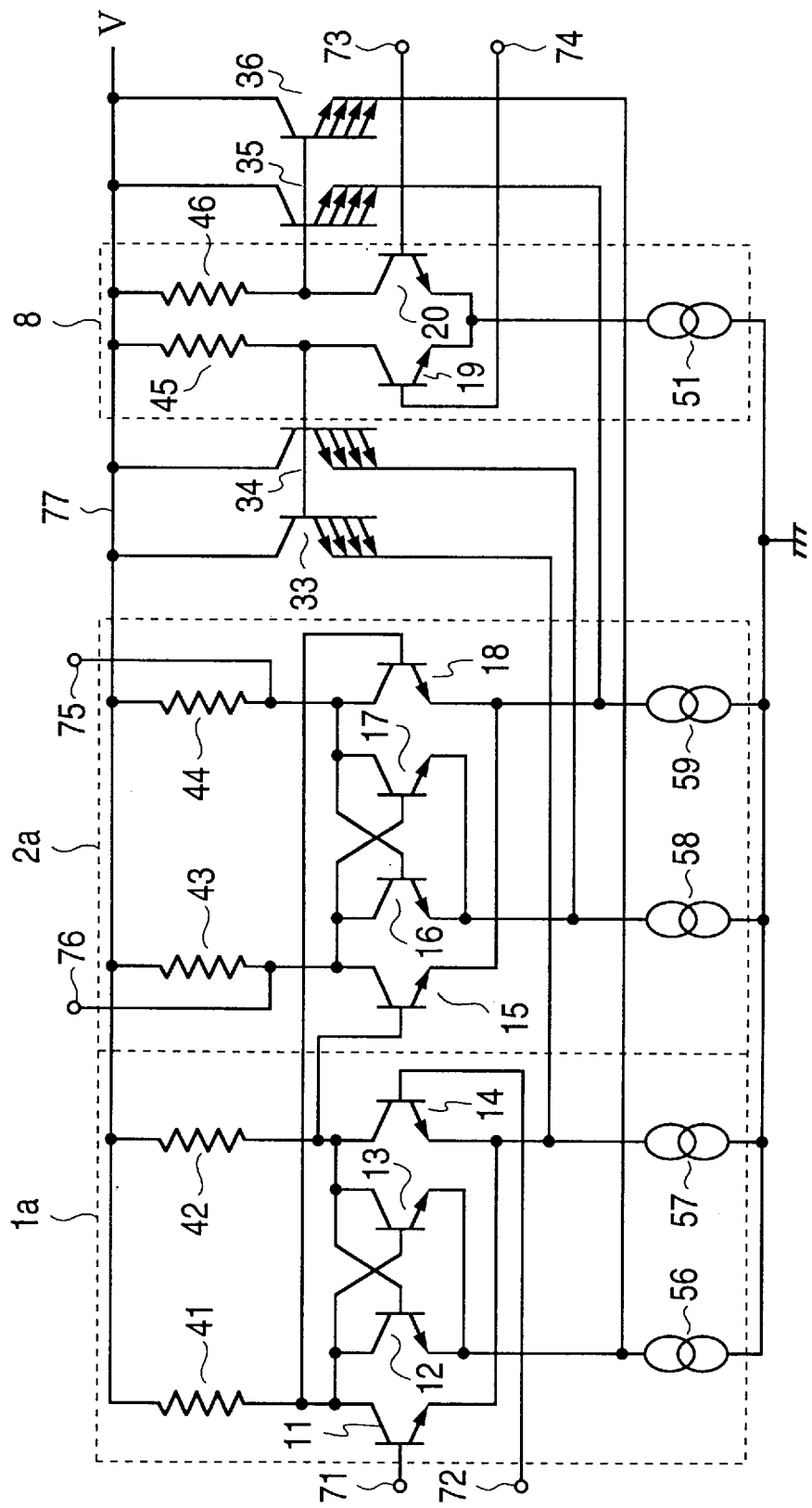
FIG. 10 is a circuit diagram of a further example of still another prior art F/F circuit.

As described, since the F/F circuit of this embodiment has the Tr's 11 to 14, the Tr's 15 to 18 and the Tr's 19 and 20 arranged as the vertical 1-step construction similarly to the previously described conventional circuit shown in FIG. 10, it is possible to perform the flip-flop operation even when the power source voltage is 1V or less. Since, in the previously described F/F circuit shown in FIG. 10, the clock signals are forcible and the signals having different values are differentially input, there is the problem in stable operation. In this embodiment, however, the flip-flop operation at low voltage becomes more stable since the signals having the same threshold values are differentially input, in view of the circuit construction thereof.

Further, in the F/F circuit as shown in FIG. 10, currents always flow through the five current sources. Since, in the embodiment, however, each current source is ON/OFF controlled according to the state of the clock signals, the number of current sources which are conductive in a certain state (for example, in a state where the terminal 73 is high and the terminal 74 is low) is three, that is, the Tr's 22 and 23 and the current source 51. Therefore, it becomes possible to operate the circuit with smaller current.

Further, since, in this embodiment, the circuit can be constructed with transistors having the same size and without using large Tr's, it is possible to make the circuit size small and to thereby realize a compact F/F circuit.

Figure 4:
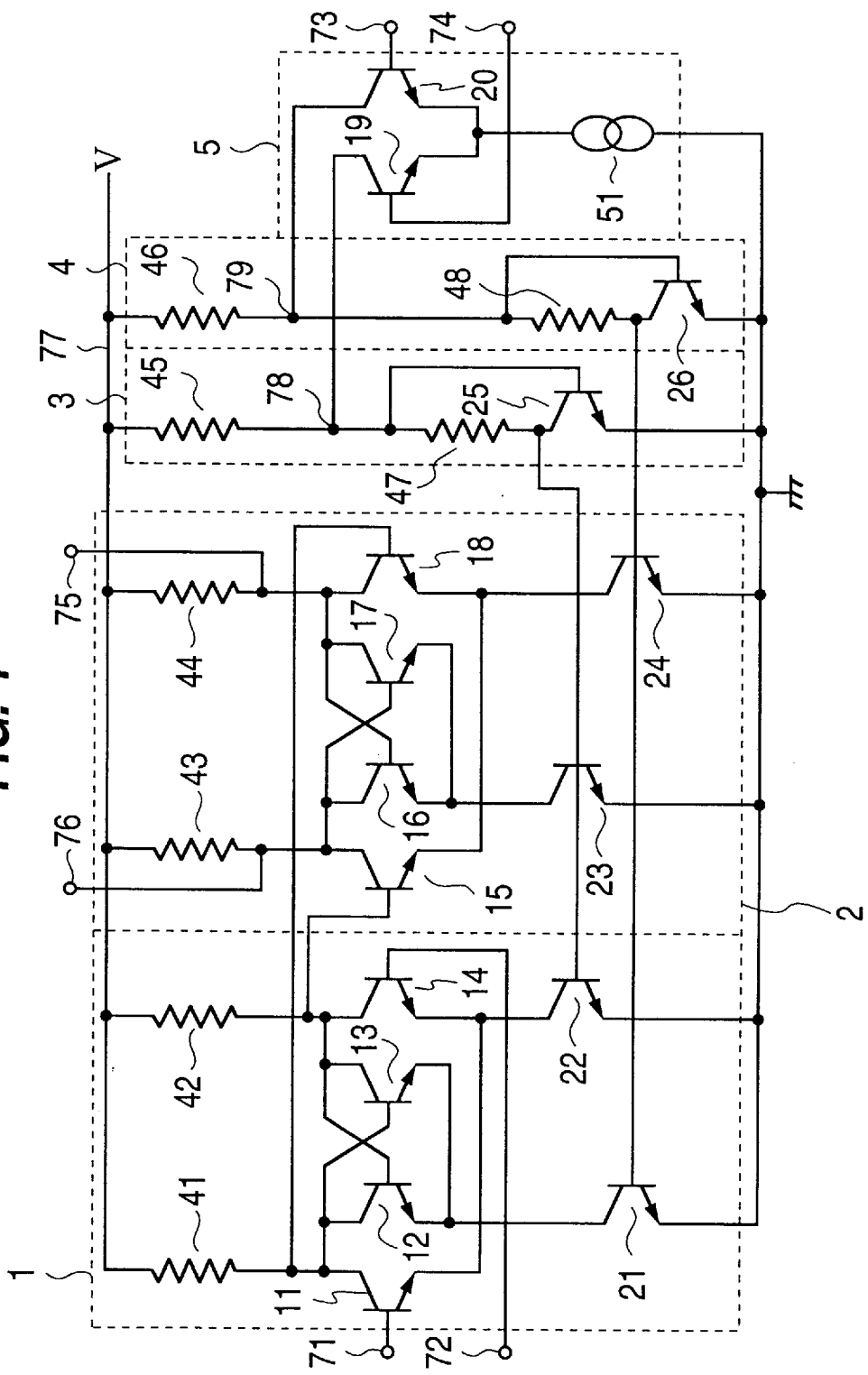
FIG. 4 is a circuit diagram of a F/F circuit according to a second embodiment of the present invention.

FIG. 4 is a circuit diagram of the F/F circuit according to a second embodiment of the present invention. As shown in FIG. 4, the F/F circuit according to this embodiment comprises a master side and slave side latch/hold circuits 1 and 2, first and second bias circuits 3 and 4 for operating the master side and slave side latch/hold circuits 1 and 2 and a control circuit 5 for pulling down a potential of one of nodes 78 and 79, similarly to the F/F circuit shown in FIG. 1. The F/F circuit of this embodiment differs from the F/F circuit shown in FIG. 1 in that collectors of Tr's 25 and 26 of the respective first and second bias circuits 3 and 4 are not short-circuited to their bases but connected to respective resistors 47 and 48.

Since, in this embodiment, the resistors 47 and 48 are connected between the collectors and the bases of the Tr's 25 and 26, respectively, when the base potentials of the Tr's 25 and 26 are increased (decreased) due to increase (decrease) of the power source voltage, the collector potentials of the respective transistors are decreased (increased). Therefore, there is a feedback effect that, due to the decrease (increase) of the collector potentials of the respective transistors, the collector-emitter voltages Vce of the Tr's 25 and 26 are decreased (increased), the collector currents are decreased (increased) and the base potentials are decreased (increased), respectively. Therefore, even if the power source voltage supplied to a power source line 77 is varied, a variation of current value flowing through the Tr's 21–24 which are current sources can be restricted, resulting in that a stable flip-flop operation can be realized.

Figure 5:
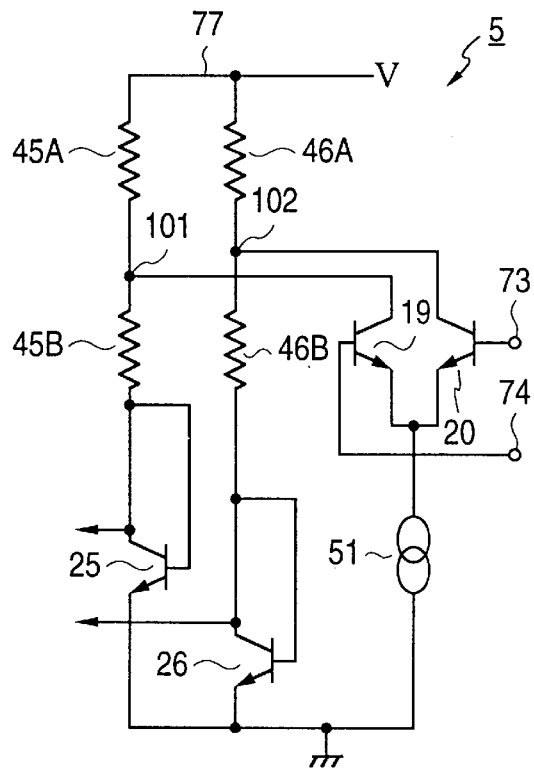
FIG. 5 is a circuit diagram of bias circuits and a control circuit of a F/F circuit according to a third embodiment of the present invention.

FIG. 5 is a circuit diagram of bias circuits and a control circuit of a F/F circuit according to a third embodiment of the present invention. As shown in FIG. 5, it shows a portion of the F/F circuit shown in FIG. 1, which includes the first and second bias circuits 3 and 4 and the control circuit for pulling down the node potential and featured by a use of resistors 45A and 45B obtained by dividing the resistor 45 and resistors 46A and 46B obtained by dividing the resistor 46. In this circuit too, it is possible to pull down a potential of one of a junction point (node 101) between the resistors 45A and 45B and a junction point (node 102) between the resistors 46A and 46B to thereby stabilize the bias voltage to be supplied to the latch/hold circuit by supplying clocks to Tr's 19 and 20 forming the control circuit.

Figure 6:
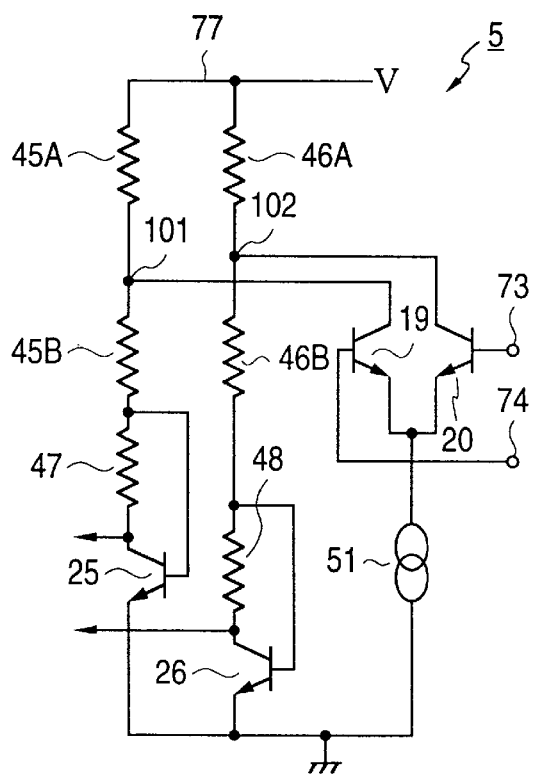
FIG. 6 is a circuit diagram of bias circuits and a control circuit of a F/F circuit according to a fourth embodiment of the present invention.

FIG. 6 is a circuit diagram of bias circuits and a control circuit of a F/F circuit according to a fourth embodiment of the present invention. As shown in FIG. 6, in this embodiment, the bias circuits shown in FIGS. 4 and 5 are combined, in which resistors 47 and 48 are connected between collectors and bases of Tr's 25 and 26 and the resistors 45A and 45B and the resistors 46A and 46B which are obtained by dividing the resistors 45 and 46 in FIG. 4 are used. It is possible to stabilize the bias voltage to be supplied to the latch/hold circuit by alternately pulling down a potential of one of junction points 101 and 102 between the resistors 45A and 45B and between the resistors 46A and 46B.

Figure 7:
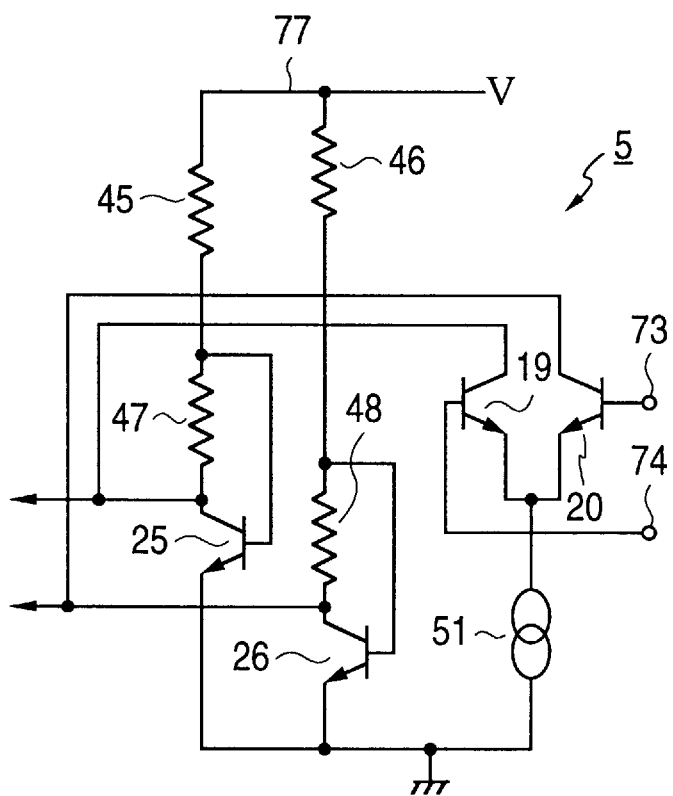
FIG. 7 is a circuit diagram of bias circuits and a control circuit of a F/F circuit according to a fifth embodiment of the present invention.
Figure 8:
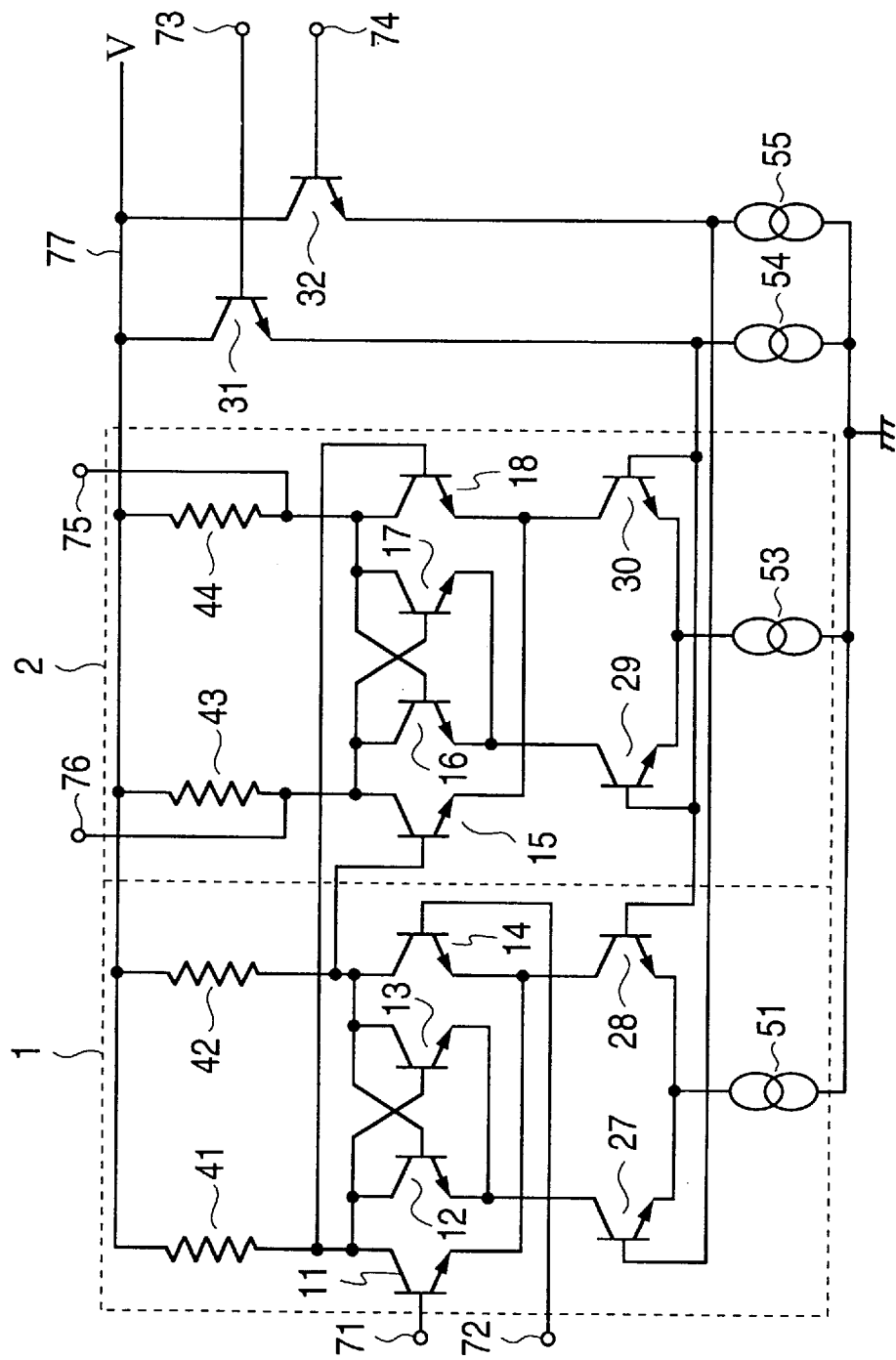
FIG. 8 is a circuit diagram of an example of a prior art F/F circuit.

FIG. 7 is a circuit diagram of bias circuits and a control circuit of a F/F circuit according to a fifth embodiment of the present invention. As shown in FIG. 7, in this embodiment, collectors of Tr's 19 and 20 are directly connected to collectors of Tr's 25 and 26, respectively, to pull down a potential of one of them according to a positive or negative clock signal.

Incidentally, in the bias circuits of such a F/F circuit, one of the Tr's 25 and 26 becomes conductive and the other becomes non-conductive by pulling down a collector potential of one of the Tr's 25 and 26 according to the clock signal.

As described hereinbefore, the F/F circuit of the present invention has an effect that it can be stably operated with the power source voltage as low as 1V or less by the circuit construction including the master side and slave side latch/hold circuit 1 and 2 each of an ECL vertical 1-step construction, the first and second bias circuits 3 and 4 for biasing current sources of these latch/hold circuits and the control circuit 5 for pull-down controlling these first and second bias circuits by the clock signals and it can operate with small current by selectively ON/OFF controlling the current sources. Further, the present invention has another effect that it can be highly integrated due to the fact that the Tr's constituting the respective circuits have the same size.

What is claimed is:

1. A flip-flop circuit comprising:

a master side circuit receiving a data signal and including two differential circuits, two loads and two current sources, said current sources being activated by receiving respective bias voltages to produce and supply currents to said loads and said differential circuits;

a slave side circuit coupled to said master side circuit and including two differential circuits, two loads and two current sources, said current sources being activated by receiving respective bias voltages to produce and supply currents to said loads and said differential circuits;

a first bias circuit producing a first voltage which is to be supplied to one of said current sources of said master side circuit and one of said current sources of said slave side circuit as respective bias voltages;

a second bias circuit producing a second voltage which is to be supplied to the other of said current sources of said master side circuit and the other of said current sources of said slave side circuit as respective bias voltages; and a control circuit including a differential circuit coupled to said first and second bias circuits, said differential circuit receiving a clock signal and controlling said first and second bias circuits to produce said first and second voltages in a complementary manner.

2. A flip-flop circuit comprising:

a master side circuit receiving a data signal and including two differential circuits, two loads and two current sources, said current sources supplying currents to said loads and said differential circuits:

a slave side circuit coupled to said master side circuit and including two differential circuits, two loads and two current sources, said current sources supplying currents to said loads and said differential circuits;

a first bias circuit producing a first voltage for biasing one of said current sources of said master side circuit and one of said current sources of said slave side circuit;

a second bias circuit producing a second voltage for biasing the other of said current sources of said master side circuit and the other of said current sources of said slave side circuit; and a control circuit coupled to said first and second bias circuits, said control circuit including a first transistor and a second transistor to form a differential circuit, said first transistor and said second transistor each having a base for receipt of said clock signal and being responsive to said clock signal to chance said first and second voltages in a complementary manner;

wherein said first bias circuit includes a first impedance element connected between a first power supply line and a first node and a first voltage element connected between said first node and a second power supply line and produces said first voltage at said first node, and said second bias circuit includes a second impedance element connected between said first power supply line and a second node and a second voltage element connected between said second node and said second power supply line and produces said second voltage at said second node, said first transistor having a collector connected to said first node, and said second transistor having a collector connected to said second node.

3. The circuit as claimed in claim 2, wherein each of said first and second impedance elements is a resistor and each of said first and second voltage elements is a diode-connected transistor.

4. The circuit as claimed in claim 2, wherein said first voltage element includes a first resistive element and a third transistor connected in series between said first node and said second power supply line, said third transistor having a base connected to said first node, said second voltage element including a second resistive element and a fourth transistor connected in series between said second node and said second power supply line, and said fourth transistor having a base connected to said second node.

5. The circuit as claimed in claim 2, wherein each of said first and second voltage elements includes a resistive element and a diode-connected transistor connected in series between an associated one of said first and second nodes and said second power supply line.

6. The circuit as claimed in claim 5, wherein said diode-connected transistor has an additional resistive element connected between base and collector thereof.

7. The circuit as claimed in claim 2, wherein said each of said first and second impedance elements includes first and second resistors connected in series between said first power supply line and an associated one of said first and second nodes, and each of said first and second voltage elements includes a transistor connected between said second power supply line and said associated one of said first and second nodes and having a base connected to a connection point of said first and second resistors.

* * * * *